(12) United States Patent
Cheng et al.

(10) Patent No.: US 9,059,288 B2
(45) Date of Patent: Jun. 16, 2015

(54) OVERLAPPED III-V FINFET WITH DOPED SEMICONDUCTOR EXTENSIONS

(71) Applicant: International Business Machines Corporation, Armonk, NY (US)

(72) Inventors: Cheng-Wei Cheng, White Plains, NY (US); Effendi Leobandung, Stormville, NY (US); Kuen-Ting Shiu, Yorktown Heights, NY (US); Yanning Sun, Scarsdale, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 168 days.

(21) Appl. No.: 13/935,776

(22) Filed: Jul. 5, 2013

(65) Prior Publication Data

US 2014/0377918 A1   Dec. 25, 2014

Related U.S. Application Data

(63) Continuation of application No. 13/923,629, filed on Jun. 21, 2013.

(51) Int. Cl.
| | |
|---|---|
| H01L 29/78 | (2006.01) |
| H01L 29/205 | (2006.01) |
| H01L 29/267 | (2006.01) |
| H01L 29/66 | (2006.01) |

(52) U.S. Cl.
CPC ............ *H01L 29/785* (2013.01); *H01L 29/205* (2013.01); *H01L 29/267* (2013.01); *H01L 29/66545* (2013.01); *H01L 29/66575* (2013.01); *H01L 29/66795* (2013.01)

(58) Field of Classification Search
CPC ............ H01L 27/0886; H01L 27/1211; H01L 21/823431; H01L 21/823821; H01L 21/845

USPC .................... 257/615; 438/283, 157
See application file for complete search history.

(56) References Cited

U.S. PATENT DOCUMENTS

| | | | |
|---|---|---|---|
| 4,679,307 A | 7/1987 | Barsony | |
| 4,873,558 A | 10/1989 | Antreasyan et al. | |
| 5,411,914 A | 5/1995 | Chen et al. | |
| 5,479,033 A | 12/1995 | Baca et al. | |

(Continued)

OTHER PUBLICATIONS

Terao, R., et al., "InP/InGaAs Composite Metal-Oxide-Semiconductor Field-Effect Transistors with Regrown Source and Al2O3 Gate Dielectric Exhibiting Maximum Drain Current Exceeding 1.3mA/mum", Applied Physics Express, May 2011, vol. 4, No. 5, pp. 054201 (3 pp.), Presented at the Japan Society of Applied Physics through the Institute of Pure and Applied Physics.

*Primary Examiner* — Yu-Hsi D Sun
(74) *Attorney, Agent, or Firm* — Scully, Scott, Murphy & Presser, P.C.; Louis J. Percello

(57) ABSTRACT

A semiconductor structure that includes a semiconductor fin comprising an III-V compound semiconductor material. A functional gate structure straddles a portion of the semiconductor fin. A semiconductor channel material having an electron mobility greater than silicon and comprising a different semiconductor material than the semiconductor fin and is located beneath the functional gate structure. The semiconductor channel material is present on at least each vertical sidewall of the semiconductor fin. A dielectric spacer is located on each vertical sidewall surface of the functional gate structure. A doped semiconductor is located on each side of the functional gate structure and underneath each dielectric spacer. A portion of the doped semiconductor material located beneath each dielectric spacer directly contacts a sidewall surface of semiconductor channel material located on each vertical sidewall of the semiconductor fin.

10 Claims, 17 Drawing Sheets

(56) References Cited

U.S. PATENT DOCUMENTS

| | | |
|---|---|---|
| 5,990,531 A | 11/1999 | Taskar et al. |
| 8,258,498 B2 | 9/2012 | Majhi et al. |
| 2009/0042344 A1 | 2/2009 | Ye et al. |
| 2011/0147842 A1* | 6/2011 | Cappellani et al. ........... 257/365 |

* cited by examiner

OVERLAPPED III-V FINFET WITH DOPED SEMICONDUCTOR EXTENSIONS

CROSS REFERENCE TO RELATED APPLICATION

This application is a continuation of U.S. patent application Ser. No. 13/923,629, filed Jun. 21, 2013 the entire content and disclosure of which is incorporated herein by reference.

BACKGROUND

The present application relates to a semiconductor structure and a method of forming the same. More particularly, the present application relates to a fin field effect transistor (finFET) containing an III-V compound semiconductor fin and an undercut extension region located beneath a dielectric spacer that is present on each vertical sidewall of a functional gate structure and a method of forming the same.

Throughout the evolution and advancement of semiconductor devices, reducing the size and power consumption of the devices, while maintaining or improving a high processing capacity have long been design goals. Planar field-effect transistor (FET) devices, which have been widely used in integrated circuits for the past several decades, have been found to be increasingly inefficient on the nanometer scale. Reducing the size of the channel between the terminals of planar transistors to this scale leads to an inefficient leakage of current in the off-state of the transistor, resulting in an increase in power consumption in its idle state.

Multi-gate field-effect transistors (MuGFET) have been developed to address this problem, as such transistors incorporate several gates that surround the channel between a source and drain terminal of the transistor on a plurality of surfaces, thereby enabling the suppression of leakage current in the off-state. There are several different types of multi-gate devices. FinFET and Trigate devices are two examples. FinFET devices include a thin fin, which can be made of silicon, that provides the channel between a source and a drain. The fin can be overlaid with one or more pairs of gates, where the gates in a pair are on opposing sides of the fin.

SUMMARY

In one aspect of the present application, a semiconductor structure is provided. The semiconductor structure of the present application includes a semiconductor fin comprising an III-V compound semiconductor material located on a surface of an insulator layer. The semiconductor structure of the present application further includes a functional gate structure orientated perpendicular to and straddling a portion of the semiconductor fin, wherein a semiconductor channel material having an electron mobility greater than silicon and comprising a different semiconductor material than the semiconductor fin is located beneath the functional gate structure. In accordance with the present application, the semiconductor channel material is present on at least each vertical sidewall of the semiconductor fin. The semiconductor structure of the present application also includes a dielectric spacer located on each vertical sidewall surface of the functional gate structure. The semiconductor structure of the present application yet further includes a doped semiconductor material having a higher dopant content than both the semiconductor fin and the semiconductor channel material located on each side of the functional gate structure and underneath each dielectric spacer, wherein a portion of the doped semiconductor material located beneath each dielectric spacer directly contacts a sidewall surface of semiconductor channel material located on each vertical sidewall of the semiconductor fin.

In another aspect of the present application, a method of forming a semiconductor structure is provided. The method of the present application includes forming a semiconductor fin comprising an III-V compound semiconductor material on a surface of an insulator layer. Next, a semiconductor channel material is epitaxially grown on exposed surfaces of the semiconductor fin. The semiconductor channel material that is grown has an electron mobility greater than silicon and comprises a different semiconductor material than the semiconductor fin. Next, a gate structure is formed straddling a portion of the semiconductor fin, wherein the gate structure is orientated perpendicular to the semiconductor fin and wherein a dielectric spacer is present on each vertical sidewall of the gate structure. Portions of the semiconductor channel material are selectively etched from atop the structure not protected by the gate structure and from beneath each dielectric spacer, wherein an undercut is provided beneath each dielectric spacer. Next, a doped semiconductor material having a higher doped content than both the semiconductor fin and the semiconductor channel material is epitaxially grown on surfaces of the semiconductor fin not including the dielectric spacer and gate structure and within the undercut region.

DETAILED DESCRIPTION

Figure 1A:
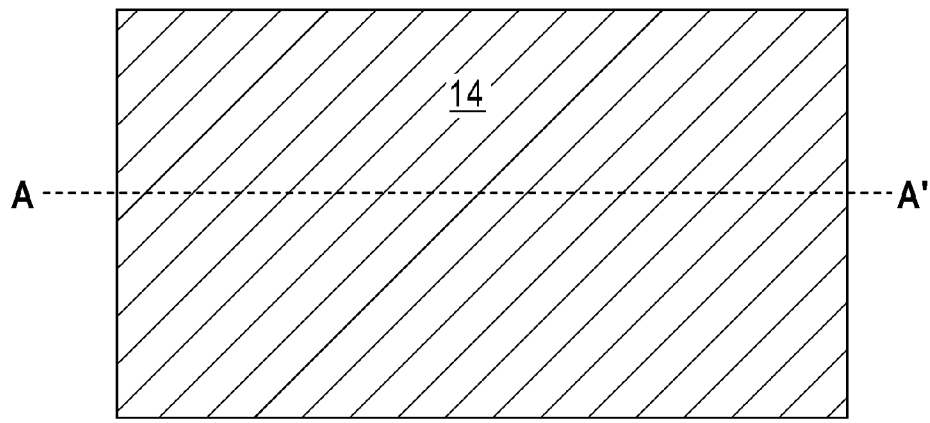
FIG. 1A is a top-down view of a semiconductor-on-insulator (SOI) substrate including, from bottom to top, a handle substrate, an insulator layer and an III-V compound semiconductor layer that can be employed in one embodiment of the present application.

The present application, which provides a fin field effect transistor (finFET) containing an III-V compound semiconductor fin and an undercut extension region located beneath a dielectric spacer that is present on each vertical sidewall of a functional gate structure and a method of forming the same will now be described in greater detail by referring to the following discussion and drawings that accompany the present application. It is noted that the drawings of the present application are provided for illustrative purposes and, as such, they are not drawn to scale. In the drawings and the description that follows, like elements are referred to by like reference numerals.

In the top down views of the drawings of the present application, different vertical cross-sectional views along various planes are illustrated. Notably, the different vertical cross-sectional views along various planes include: A-A' which is through a plane in which an III-V compound semiconductor fin will be subsequently formed or is present, B-B' through a plane perpendicular to each III-V compound semiconductor fin and in which a gate structure will be subsequently formed or is present, C-C' through a plane perpendicular to each III-V compound semiconductor fin and in which a first doped semiconductor material portion will be formed or is present, D-D' through a plane perpendicular to each III-V compound semiconductor fin and beneath a dielectric spacer and in which a second doped semiconductor material portion will be formed or is present, F-F' through a plane in which an III-V compound semiconductor fin is present and in proximity to a vertical sidewall of the III-V compound semiconductor fin. Note the cut F-F' is approximately 2 nm from the center of each fin which is shown in cut A-A'.

In the following description, numerous specific details are set forth, such as particular structures, components, materials, dimensions, processing steps and techniques, in order to provide a thorough understanding of the present application. However, it will be appreciated by one of ordinary skill in the art that the present application may be practiced with viable alternative process options without these specific details. In other instances, well-known structures or processing steps have not been described in detail in order to avoid obscuring the various embodiments of the present application.

Current III-V compound semiconductor device processing requires very low temperatures (on the order of 600° C. or less) to avoid dissociation or damage to the III-V compound semiconductor crystal structure and to the interface between the III-V compound semiconductor material and the overlaying gate dielectric. This makes self-aligned devices very difficult to form since self-aligned devices require some diffusion of dopant to form an extension overlayer. Current solutions require either complex space technology or no spacers whatsoever which is not very robust or manufacturable. In addition, traditional extension doping to create overlap for silicon transistors is through ion implantation, which is not as effective for III-V compound semiconductor materials and can cause crystal damage in the III-V compound semiconductor material.

The present application overcomes the drawbacks associated with fabricating finFET semiconductor devices including a semiconductor fin comprising an III-V compound semiconductor material by utilizing a selective etch of a semiconductor channel layer and growth of an epitaxially doped semiconductor material under a gate region (functional gate structure or sacrificial gate structure) to force controllable overlap. In some embodiments, the method of the present application can eliminate ion implantation damage. The method of the present application is now described in greater detail.

Figure 1B:
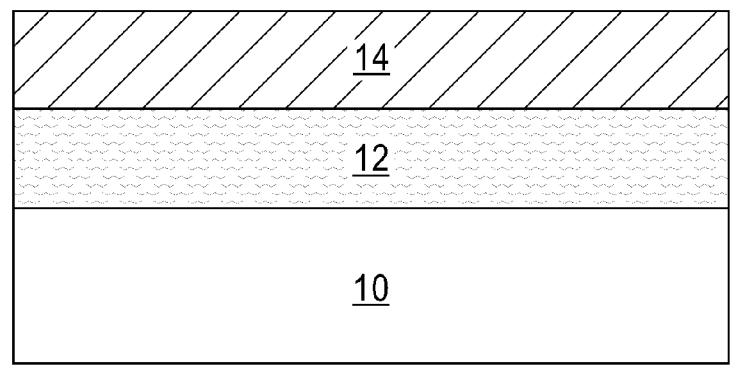
FIG. 1B is a vertical cross-sectional view of the semiconductor substrate along the vertical plane A-A' of FIG. 1A.

Referring first to FIGS. 1A and 1B, there are illustrated various views of a semiconductor-on-insulator (SOI) substrate that can be employed in one embodiment of the present application. The SOI substrate that can be employed in the present application includes, from bottom to top, a handle substrate 10, an insulator layer 12 and an III-V compound semiconductor layer 14.

The handle substrate 10 can include a semiconductor material, a conductive material, and/or a dielectric material. The handle substrate 10 provides mechanical support to the insulator layer 12 and the III-V compound semiconductor layer 14. The thickness of the handle substrate 10 can be from 30 microns to 2 mm, although lesser and greater thicknesses can also be employed.

The insulator layer 12 includes an insulator material. As used herein, an insulator material refers to a material having a resistivity greater than $3\times10^3$ Ohm-cm. The insulator layer 12 can include a dielectric material such as, for example, silicon oxide, silicon nitride, silicon oxynitride, sapphire ($Al_2O_3$), or a combination thereof. The thickness of the insulator layer 12 can be from 50 nm to 5 microns, although lesser and greater thicknesses can also be employed. In one embodiment, the insulator layer 12 and the handle substrate 10 can be a single contiguous structure including a same insulator material, i.e., the handle substrate 10 and the insulator layer 12 can be merged into a single insulating layer including a same insulating material.

The III-V compound semiconductor layer 14 includes an III-V compound semiconductor material that contains at least one element from Group IIIA (i.e., Group 13) of the Periodic Table of Elements and at least one element from Group VA (i.e., Group 15) of the Periodic Table of Elements. The range of possible formulae for suitable III-V compound semiconductor materials that can be used in the present application as the III-V compound semiconductor layer 14 is quite broad because these elements can form binary (two elements, e.g., gallium (III) arsenide (GaAs)), ternary (three elements, e.g., indium gallium arsenide (InGaAs)) and quaternary (four elements, e.g., aluminum gallium indium phosphide (AlInGaP)) alloys. In one example, the III-V compound semiconductor layer 14 of the SOI substrate is comprised of INP.

In one embodiment of the present application, the III-V compound semiconductor material that is employed in the present application as the III-V compound semiconductor layer 14 is undoped. That is, the III-V compound semiconductor material that is employed in the present application as the III-V compound semiconductor layer 14 can be intrinsic and thus is not doped with any n-type or p-type dopant. In another embodiment of the present application, the III-V compound semiconductor material that is employed in the present application as the III-V compound semiconductor layer 14 is lightly doped (i.e., has a dopant content, i.e., concentration, of greater than 0 up to, and including, 5E18 atoms/cm$^3$). In either embodiment, the III-V compound semiconductor material that is employed in the present application as the III-V compound semiconductor layer 14 has a lower dopant content than the doped semiconductor material that is used in forming the source regions, the drain regions and the extension regions of the finFET structure of the present application.

In one embodiment of the present application, the III-V compound semiconductor material that is employed in the present application as the III-V compound semiconductor layer 14 can be a single crystalline III-V compound semiconductor material. In another embodiment of the present application, the III-V compound semiconductor material that is employed in the present application as the III-V compound semiconductor layer 14 can be a polycrystalline III-V compound semiconductor material. In yet another embodiment of the present application, the III-V compound semiconductor material that is employed in the present application as the III-V compound semiconductor layer 14 can be an amorphous III-V compound semiconductor material. In one example, the III-V compound semiconductor material used as the III-V compound semiconductor layer 14 can single crystalline InP. The thickness of the III-V compound semiconductor layer 14 can be from 10 nm to 500 nm, although lesser and greater thicknesses can also be employed.

The SOI substrate that is shown in FIGS. 1A and 1B can be formed utilizing techniques well known in the art. In one example, the SOI substrate can be formed by a layer transfer process. In another example, the SOI substrate can be formed by deposition of the insulator layer 12 on a topmost surface of handle substrate 10, and thereafter depositing an III-V compound semiconductor material on a topmost surface of the insulator layer 12. A thinning step such as, for example, planarization, or oxidation and etching can be used to thin the III-V compound semiconductor material into a desired thickness.

Figure 2A:
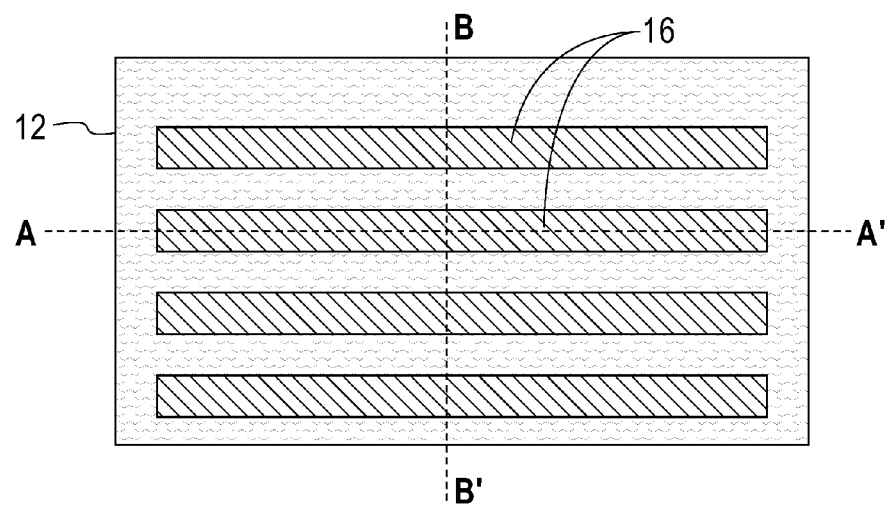
FIG. 2A is a top-down view of the (SOI) substrate shown in FIG. 1A after formation of a semiconductor structure containing a plurality of III-V compound semiconductor fins.
Figure 2B:
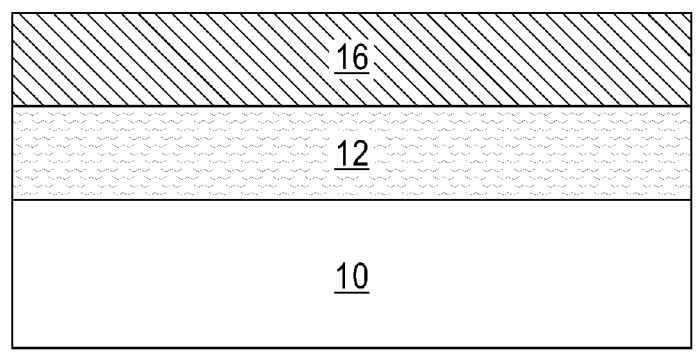
FIG. 2B is a vertical cross-sectional view of the semiconductor structure along the vertical plane A-A' of FIG. 2A.
Figure 2C:
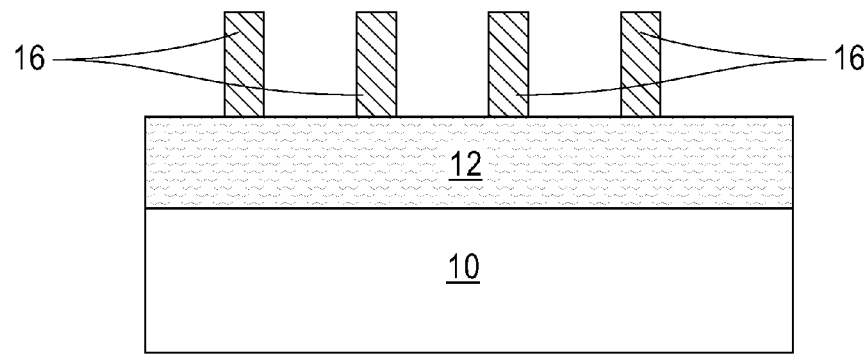
FIG. 2C is a vertical cross-sectional view of the semiconductor structure along the vertical plane B-B' of FIG. 2A.

Referring now to FIGS. 2A, 2B and 2C, there are illustrated various views of the SOI substrate of FIGS. 1A and 1B after formation of a semiconductor structure containing a plurality of III-V compound semiconductor fins 16. As is shown, each III-V compound semiconductor fin of the plurality of III-V compound semiconductor fins 16 is spaced apart from its nearest neighboring III-V compound semiconductor fin(s) 16. Also, each III-V compound semiconductor fin of the plurality of III-V compound semiconductor fins 16 is oriented parallel to each other.

Each III-V compound semiconductor fin of the plurality of III-V compound semiconductor fins 16 has a bottommost surface in direct contact with a topmost surface of the insulator layer 12. Each III-V compound semiconductor fin of the plurality of III-V compound semiconductor fins 16 comprises a same III-V compound semiconductor material as that of the III-V compound semiconductor layer 14.

While the present application is illustrated with a plurality of III-V compound semiconductor fins 16, embodiments in which a single III-V compound semiconductor fin 16 is employed in lieu of a plurality of III-V compound semiconductor fins 16 are expressly contemplated herein.

The semiconductor structure shown in FIGS. 2A, 2B and 2C can be formed by lithography and etching. Lithography can include forming a photoresist (not shown) on the topmost surface of the III-V compound semiconductor layer 14, exposing the photoresist to a desired pattern of radiation, and then developing the exposed photoresist with a conventional resist developer to provide a patterned photoresist atop the III-V compound semiconductor layer 14. At least one etch is then employed which transfers the pattern from the patterned photoresist into the III-V compound semiconductor layer 14 utilizing the underlying insulator layer 12 as an etch stop. In one embodiment, the etch used for pattern transfer may include a dry etch process such as, for example, reactive ion etching, plasma etching, ion beam etching or laser ablation. In another embodiment, the etch used for pattern transfer may include a wet chemical etchant such as, for example, KOH (potassium hydroxide). In yet another embodiment, a combination of a dry etch and a wet chemical etch may be used to transfer the pattern. After transferring the pattern into the III-V compound semiconductor layer 14, the patterned photoresist can be removed utilizing a conventional resist stripping process such as, for example, ashing.

In some embodiments (not shown), a hard mask such as, for example, a dielectric oxide can be formed by, for example, a deposition process, on the topmost surface of the III-V compound semiconductor layer 14 prior to application of the photoresist. In such an embodiment, the pattern from the patterned photoresist is first transferred into the hard mask and then into the underlying III-V compound semiconductor layer 14. The patterned photoresist can be removed anytime after the hard mask has been patterned. Remaining portions of the hard mask may be removed by performing a planarization process.

As used herein, an "III-V compound semiconductor fin" refers to a contiguous structure including an III-V compound semiconductor material and including a pair of substantially vertical sidewalls that are parallel to each other. As used herein, a surface is "substantially vertical" if there exists a vertical plane from which the surface does not device by more than three times the root mean square roughness of the surface.

Figure 3A:
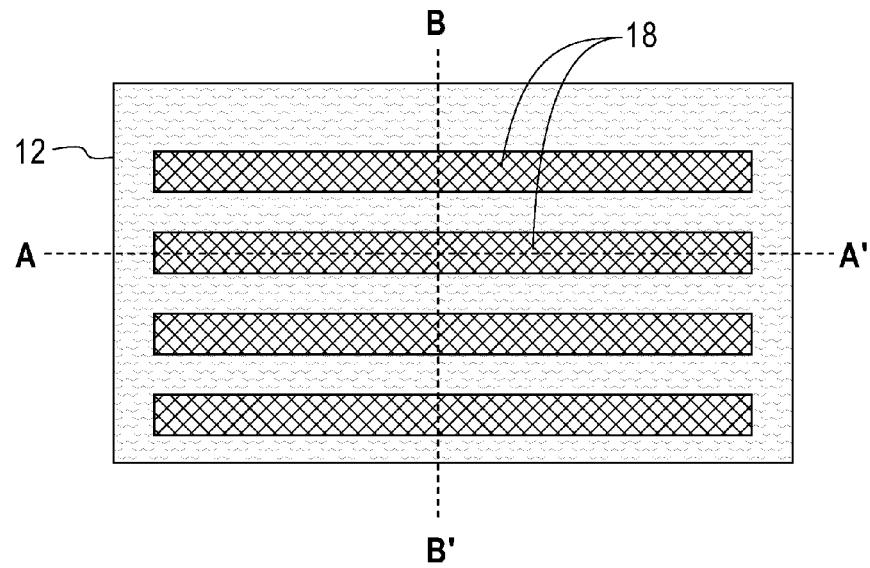
FIG. 3A is a top-down view of the semiconductor structure shown in FIG. 2A after epitaxially growing a semiconductor channel material on vertical sidewall surfaces and a topmost surface of each III-V compound semiconductor fin.
Figure 3B:
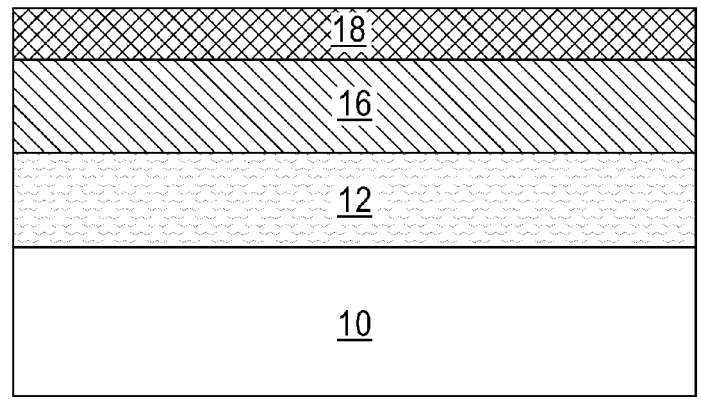
FIG. 3B is a vertical cross-sectional view of the semiconductor structure along the vertical plane A-A' of FIG. 3A.
Figure 3C:
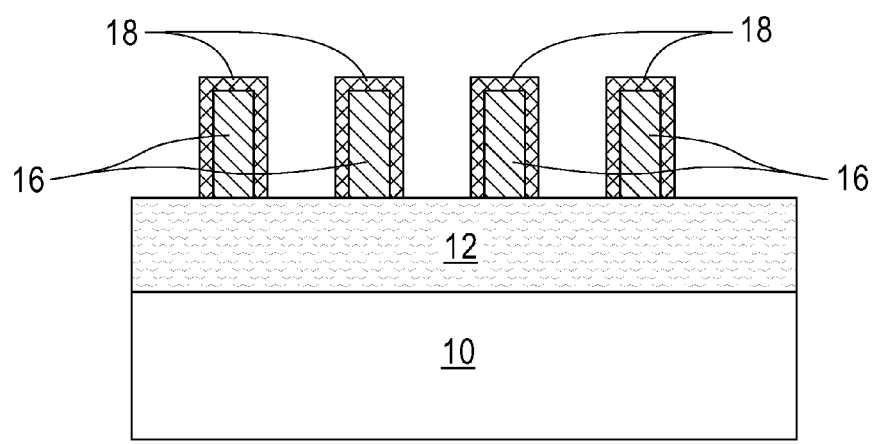
FIG. 3C is a vertical cross-sectional view of the semiconductor structure along the vertical plane B-B' of FIG. 3A.

Referring now to FIGS. 3A, 3B, and 3C, there are illustrated various views of the semiconductor structure shown in FIGS. 2A, 2B and 2C after epitaxially growing a semiconductor channel material 18 on vertical sidewall surfaces and a topmost surface of each III-V compound semiconductor fin 16. In some embodiments in which a portion of the hard mask remains atop each fin (not shown), the semiconductor channel material 18 is only formed along the vertical sidewall surfaces and a topmost surface of each III-V compound semiconductor fin 16.

The semiconductor channel material 18 that is epitaxial formed has the same or nearly the same crystalline characteristics as that of the III-V compound semiconductor fin 16. In one embodiment of the present application, the semiconductor channel material 18 that is formed can be undoped (i.e., an intrinsic semiconductor material). In another embodiment of the present application, the semiconductor channel material 18 is lightly doped (i.e., has a dopant content, i.e., concentration, of greater than 0 up to, and including, $5E18$ atoms/cm$^3$). In either embodiment, the semiconductor channel material 18 that is employed in the present application has a lower dopant content than the doped semiconductor material that is used in forming the source regions, the drain regions and the extension regions of the finFET structure of the present application. In some embodiments, the semiconductor channel material 18 can have a same dopant content as that of the semiconductor fin 16. In another embodiment, the semiconductor channel material 18 can have a different dopant content than the semiconductor fin 16.

Notwithstanding whether the semiconductor channel material 18 is undoped or doped, the semiconductor channel material 18 comprises a material that has a higher electron mobility than silicon and comprises a different semiconductor material than the III-V compound semiconductor material of the plurality of III-V compound semiconductor fins 16. In one embodiment, the semiconductor channel material 18 can comprise another III-V compound semiconductor material. For example, when InP is employed as the III-V compound semiconductor material of the plurality of III-V compound semiconductor fins 16, than the semiconductor channel material 18 can be comprised of InGaAs.

In some embodiments, the semiconductor channel material 18 can be composed of an II-VI compound semiconductor material. An II-VI compound semiconductor includes at least one element from Group IIB (i.e., Group 12) of the Periodic Table of Elements and at least one element from Group VIA (i.e., Group 16) of the Periodic Table of Elements.

In some embodiments of the present application, block mask technology can be employed to form a first set of III-V compound semiconductor fins 16 which comprises a first semiconductor channel material and a second set of III-V compound semiconductor fins 16 which comprises a second semiconductor channel material, wherein the second semiconductor channel material is different from the first semiconductor channel material.

The term "epitaxial growth and/or deposition" means the growth of a semiconductor material on a deposition surface of a semiconductor material, in which the semiconductor material being grown has the same (or nearly the same) crystalline characteristics as the semiconductor material of the deposition surface. In accordance with an embodiment of the present application, the semiconductor channel material 18 can be epitaxially grown at a temperature from 300° C. to 800° C. using a gas mixture that includes at least one source gas. In one example, the semiconductor channel material 18 can be epitaxially grown at a temperature from 400° C. to 600° C. In one embodiment of the present application, the semiconductor channel material 18 can be epitaxially grown utilizing plasma enhanced chemical vapor deposition (PECVD). In one example, a PECVD device can employ a parallel plate chamber configuration. In other embodiments, a hot-wire chemical vapor deposition process can be used in forming the semiconductor channel material 18.

In one embodiment of the present application, the at least one source gas used to form the semiconductor channel material 18 may comprise at least one Group IIIA-containing precursor and at least one group VA-containing precursor. In another embodiment of the present application, the at least one source gas used to form the semiconductor channel material 18 may comprise at least one Group IIB-containing precursor and at least one group VIA-containing precursor. If a dopant is present in the semiconductor channel material 18, a doped can be present during the epitaxial growth process.

The thickness of the semiconductor channel material 18 can be from 3 nm to 5 nm, although lesser and greater thicknesses can also be employed. In one embodiment and as shown in the drawings, the semiconductor channel material 18 is a contiguous layer which is in direct physical contact with the entirety (i.e., vertically sidewalls and topmost surface) of each III-V compound semiconductor fin 16. In another embodiment in which a portion of the hard mask remains atop each III-V compound semiconductor fin 16 (not shown), the semiconductor channel material 18 includes a first portion that is in direct physical contact with one of the vertical sidewalls of each III-V compound semiconductor fin 16, a second portion (that is disjoined from the first portion) that is in direct physical contact with another vertical sidewall of each III-V compound semiconductor fin 16. In such an embodiment, a topmost surface of each of the first and second portions of the semiconductor channel material 18 is coplanar with a topmost surface of each III-V compound semiconductor fin 16.

Figure 4A:
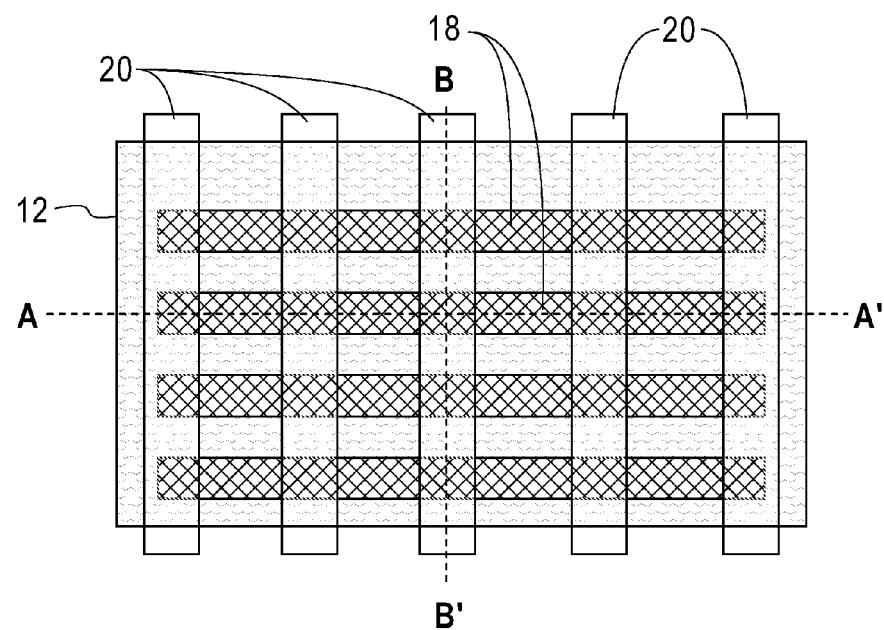
FIG. 4A is a top-down view of the semiconductor structure shown in FIG. 3A after formation of a plurality of gate structures that are orientated perpendicular to and that straddle each III-V compound semiconductor fin.
Figure 4B:
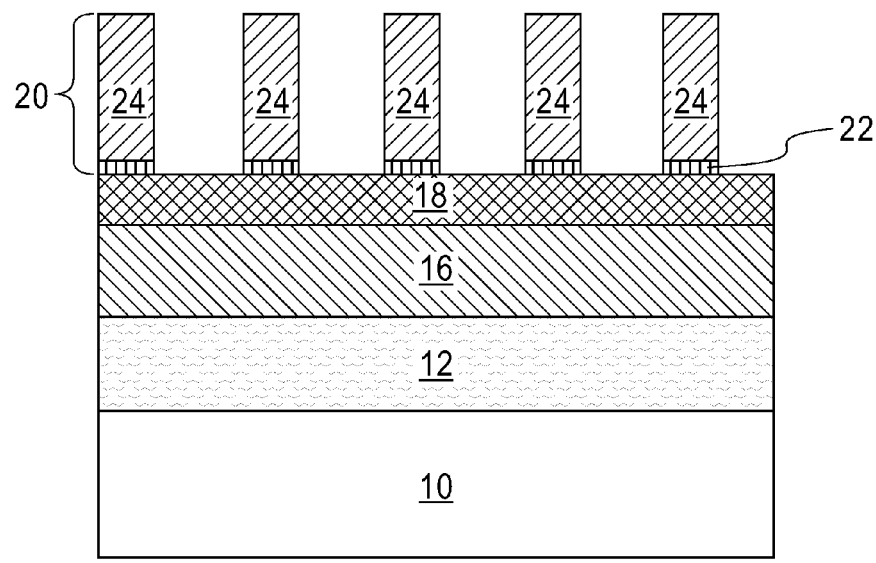
FIG. 4B is a vertical cross-sectional view of the semiconductor structure along the vertical plane A-A' of FIG. 4A.
Figure 4C:
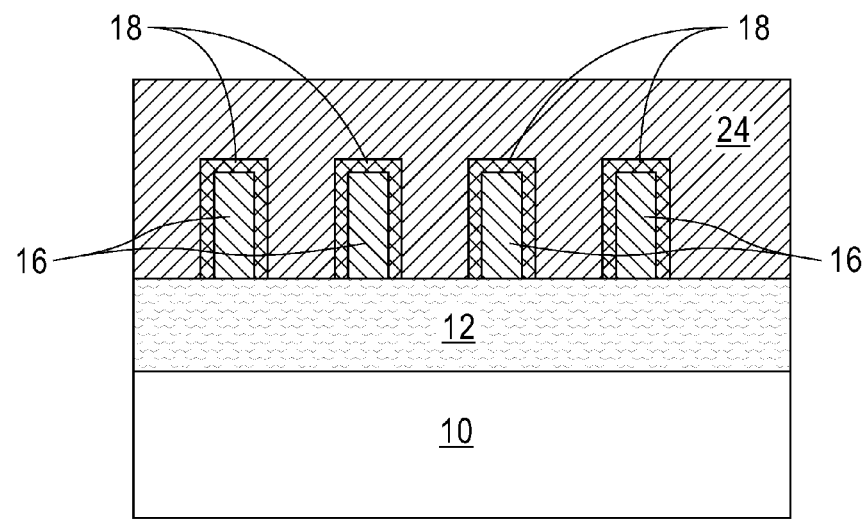
FIG. 4C is a vertical cross-sectional view of the semiconductor structure along the vertical plane B-B' of FIG. 4A.
Figure 5A:
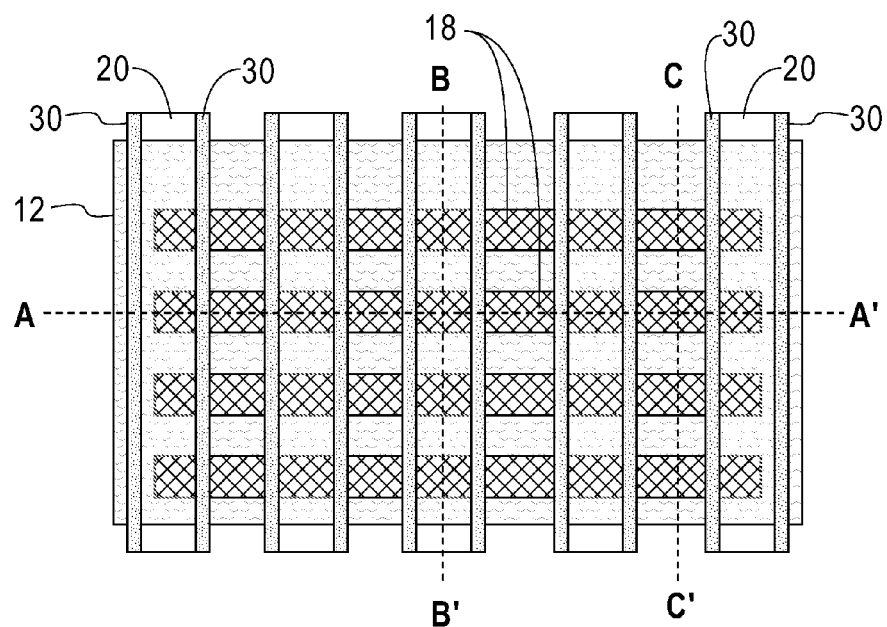
FIG. 5A is a top-down view of the semiconductor structure shown in FIG. 4A after formation of a dielectric spacer on each vertical sidewall surface of each gate structure and straddling each III-V compound semiconductor fin.
Figure 5B:
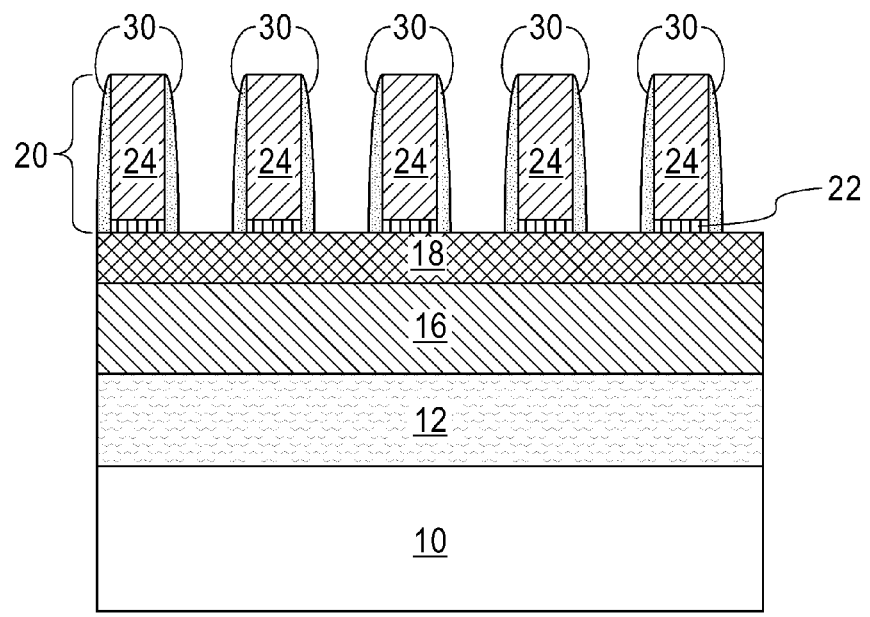
FIG. 5B is a vertical cross-sectional view of the semiconductor structure along the vertical plane A-A' of FIG. 5A.
Figure 5C:
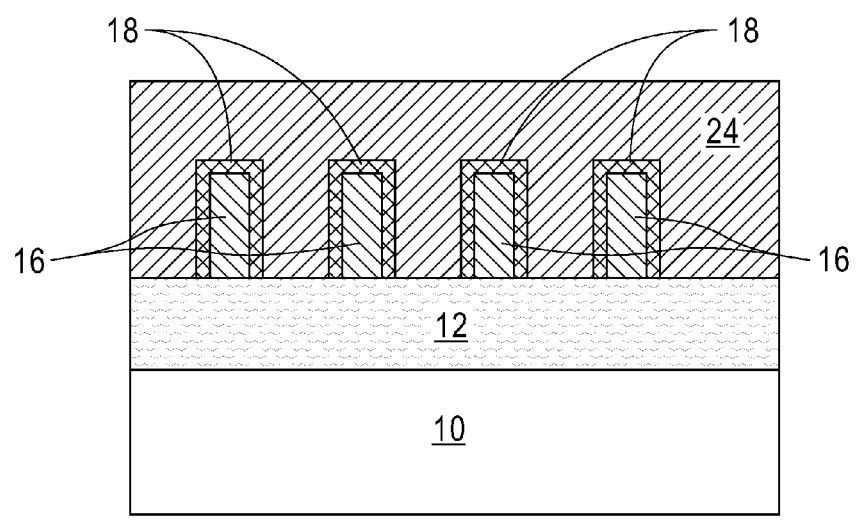
FIG. 5C is a vertical cross-sectional view of the semiconductor structure along the vertical plane B-B' of FIG. 5A.
Figure 5D:
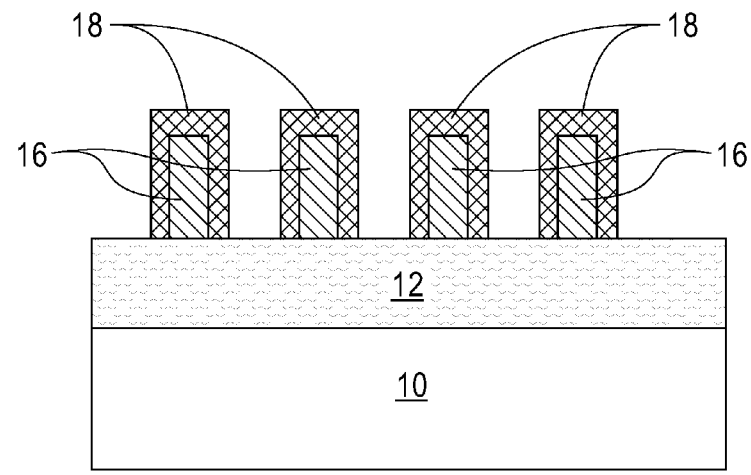
FIG. 5D is a vertical cross-sectional view of the semiconductor structure along the vertical plane C-C' of FIG. 5A.
Figure 6A:
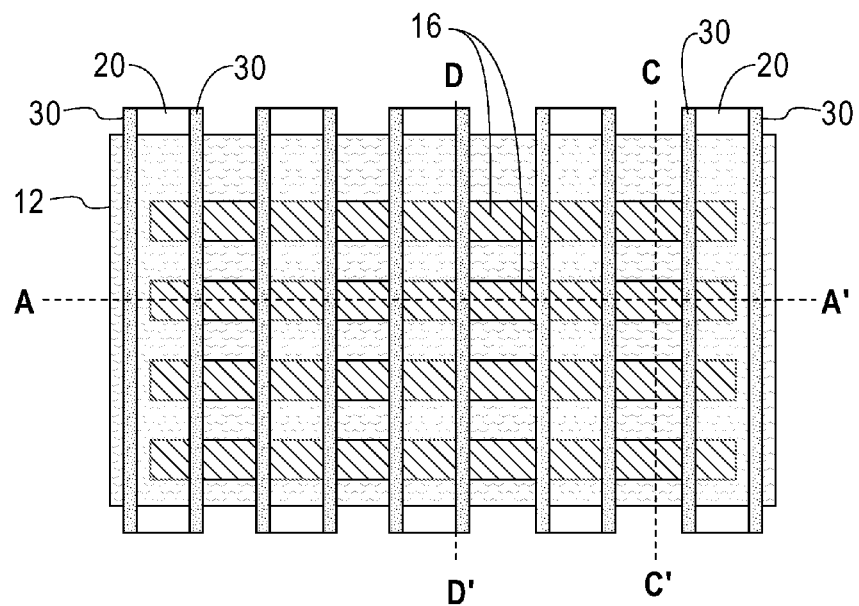
FIG. 6A is a top-down view of the semiconductor structure shown in FIG. 5A after selectively etching portions of the semiconductor channel material from atop the structure not protected by the gate structure and from beneath each dielectric spacer, wherein an undercut is provided beneath each dielectric spacer.
Figure 6B:
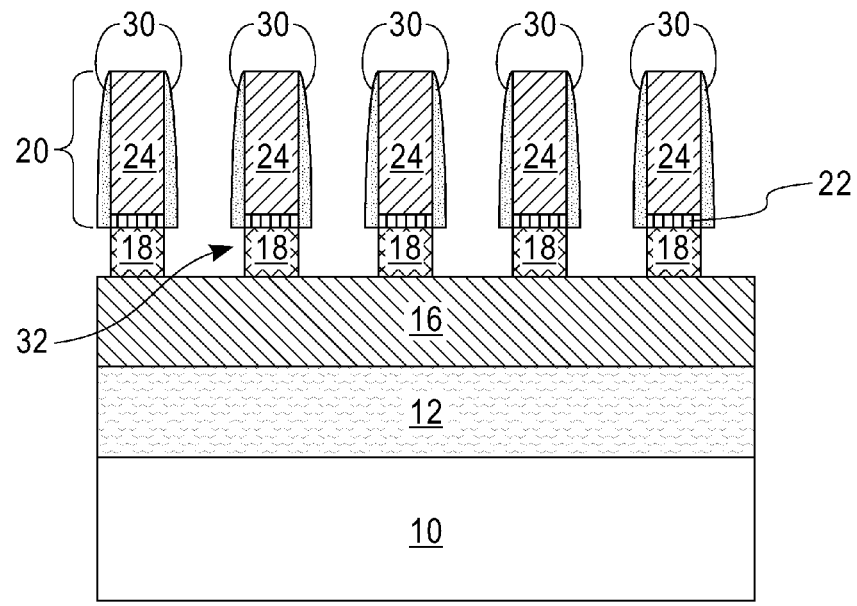
FIG. 6B is a vertical cross-sectional view of the semiconductor structure along the vertical plane A-A' of FIG. 6A.
Figure 6C:
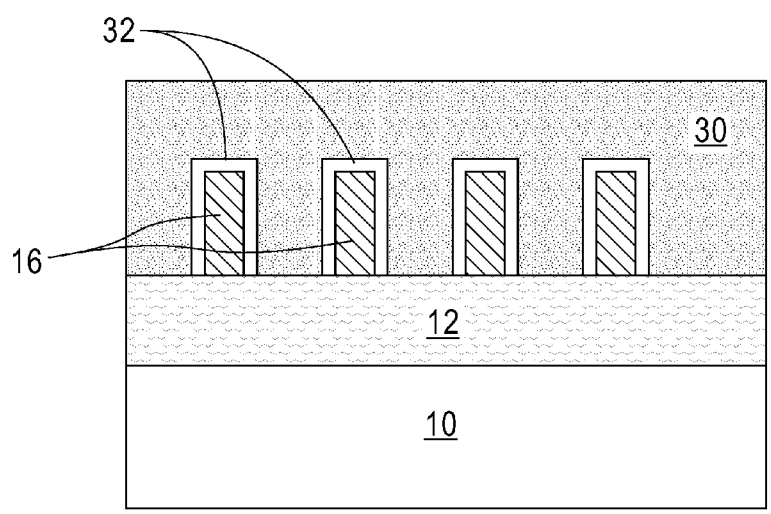
FIG. 6C is a vertical cross-sectional view of the semiconductor structure along the vertical plane D-D' of FIG. 6A.
Figure 6D:
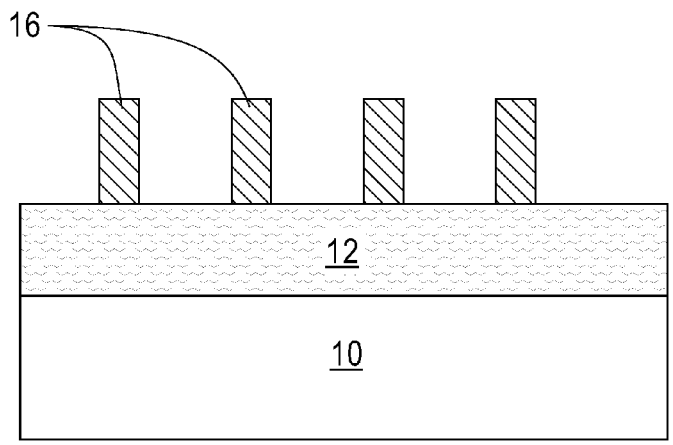
FIG. 6D is a vertical cross-sectional view of the semiconductor structure along the vertical plane C-C' of FIG. 6A.

Referring now to FIGS. 4A, 4B and 4C, there is illustrated various views of the semiconductor structure shown in FIGS. 3A, 3B and 3C after formation of a plurality of gate structures 20. As is shown, each gate structure 20 is orientated perpendicular to and straddles each III-V compound semiconductor fin 16. As is shown, each gate structure of the plurality of gate structures 20 is spaced apart from its nearest neighboring gate structure 20. While the present application is illustrated with a plurality of gate structures 20, embodiments in which a single gate structure is employed in lieu of a plurality of gate structures are expressly contemplated herein.

In one embodiment of the present application, each gate structure of the plurality of gate structures 20 comprises a functional gate structure. The term "functional gate structure" is used throughout the present application as a permanent gate structure used to control output current (i.e., flow of carriers in the channel) of a semiconducting device through electrical or magnetic fields. In another embodiment of the present application each gate structure of the plurality of gate structures 20 comprises a sacrificial gate structure. The term "sacrificial gate structure" is used throughout the present application to denote a material that serves as a placeholder structure for a functional gate structure to be subsequently formed. In yet another embodiment, a first set of gate structures of the plurality of gate structures 20 comprises a functional gate structure, while a second set of gate structures of the plurality of gate structures 20 comprises a sacrificial gate structure.

In the embodiment in which a functional gate structure is employed (see, for example, FIGS. 4A, 4B and 4C), each functional gate structure includes a gate stack of, from bottom to top, a gate dielectric material portion 22 and a gate conductor material portion 24. In such an embodiment, the functional gate structure(s) is(are) formed by first forming a blanket layer of a gate dielectric material onto all the exposed surfaces shown in FIGS. 3A, 3B and 3C. Next, a blanket layer of a gate conductor material is formed atop the blanket layer of gate dielectric material. The material stack containing the blanket layer of gate conductor material and the blanket layer of gate dielectric material is then patterned by lithography and etching forming at least one gate stack of a functional gate. As is shown in the embodiment illustrated in FIGS. 4A, 4B and 4C, sidewall surfaces of the gate dielectric material portion 22 and the gate conductor material portion 24 are vertically coincident to (i.e., vertically aligned with) each other.

The gate dielectric material that provides the gate dielectric material portion 22 of the functional gate structure can be a high k material having a dielectric constant greater than silicon oxide. Exemplary high k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon oxide, and a high k gate dielectric can be formed.

The gate dielectric material used in providing the gate dielectric material portion 22 of the functional gate structure can be formed by any deposition technique including, for example, chemical vapor deposition (CVD), plasma enhanced chemical vapor deposition (PECVD), physical vapor deposition (PVD), sputtering, or atomic layer deposition. In one embodiment of the present application, the gate dielectric material used in providing the gate dielectric material portion 22 of the functional gate structure can have a thickness in a range from 1 nm to 10 nm. Other thicknesses that are lesser than or greater than the aforementioned thickness range can also be employed for the gate dielectric material.

The gate conductor material used in providing the gate conductor material portion 24 of the functional gate structure can include any conductive metal material including, for example, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. The gate conductor material used in providing the gate conductor material portion 24 of the functional gate structure can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, the gate conductor material used in providing the gate conductor material portion 24 of the functional gate structure has a thickness from 1 nm to 100 nm. Other thicknesses that are lesser than or greater than the aforementioned thickness range can also be employed for the gate conductor material.

In embodiments in which the gate structure is a sacrificial gate structure (not shown in FIGS. 4A, 4B and 4C), the sacrificial gate structure(s) is(are) formed by first providing a blanket layer of a sacrificial gate material on the exposed surfaces of the structure shown in FIGS. 3A, 3B and 3C. The blanket layer of sacrificial gate material can be formed, for example, by chemical vapor deposition or plasma enhanced chemical vapor deposition. The thickness of the blanket layer of sacrificial gate material can be from 50 nm to 300 nm, although lesser and greater thicknesses can also be employed. The blanket layer of sacrificial gate material can include any material that can be selectively removed from the structure during a subsequently performed etching process. In one embodiment, the blanket layer of sacrificial gate material may be composed of polysilicon. In another embodiment of the present application, the blanket layer of sacrificial gate material may be composed of a metal such as, for example, Al, W, or Cu.

After providing the blanket layer of sacrificial gate material, the blanket layer of sacrificial gate material can be patterned by lithography and etching so as to form the sacrificial gate structure(s).

Notwithstanding whether the gate structures 20 are functional gate structures or sacrificial gate structures, the plurality of gate structures 20 are oriented parallel to one another, yet perpendicular to each III-V compound semiconductor fin 16. In one embodiment, the distance between neighboring gate structures 20 can be from 10 nm to 200 nm. In another embodiment, the distance between neighboring gate structures 20 can be from 25 nm to 50 nm. In one embodiment, each gate structure 20 that is formed has a width from 10 nm to 100 nm, and a length from 50 nm to 20,000 nm. In another embodiment, each gate structure 20 that is formed has a width from 15 nm to 20 nm, and a length from 500 nm to 1000 nm.

Referring now FIGS. 5A, 5B, 5C and 5D, there are illustrated various views of the semiconductor structure shown in FIGS. 4A, 4B and 4C after formation of a dielectric spacer 30 on each vertical sidewall surface of each gate structure 20 and straddling each III-V compound semiconductor fin 16. Dielectric spacer 30 can be formed by first providing a spacer material and then etching the spacer material. The spacer material may be composed of any dielectric spacer material including, for example, a dielectric oxide, dielectric nitride, and/or dielectric oxynitride. In one example, the spacer material used in providing the dielectric spacer 30 may be composed of silicon oxide or silicon nitride. The spacer material can be provided by a deposition process including, for example, chemical vapor deposition (CVD), plasma enhanced chemical vapor deposition (PECVD), or physical vapor deposition (PVD). The etching of the spacer material may comprise a dry etch process such as, for example, a reactive ion etch.

Referring now to FIGS. 6A, 6B, 6C and 6D, there are illustrated various views of the semiconductor structure shown in FIGS. 5A, 5B, 5C and 5D after selectively etching portions of the semiconductor channel material 18 from atop each III-V compound semiconductor fin 16 not protected by the gate structure 20 and from beneath each dielectric spacer 30. This selective etching step provides an undercut region 32 beneath each dielectric spacer 30. This selective etching step also exposes a topmost surface of each III-V compound semiconductor fin 16 that is not protected by gate dielectric 30 and gate structure 20. The undercut region 32 that is formed can also be referred to as a region of the structure in which an extension region can be subsequently formed, while the regions including the now exposed topmost surfaces of the III-V compound semiconductor fins 16 can be referred to as the regions in which the source and drain of the FinFET device will be subsequently formed.

The selective etch that is used in providing the semiconductor structure shown in FIGS. 6A, 6B, 6C and 6D includes an anisotropic etching process. In one embodiment, the anisotropic etching process includes a chemical wet etching process. In one example, and when the semiconductor channel material 18 is comprised of InGaAs and each III-V compound semiconductor fin 16 is composed of InP, HCl and/or $H_2O_2$ can be used as a chemical etchant for selectively etching portions of the semiconductor channel material 18 from atop the structure not protected by the gate structure 20 and beneath each dielectric spacer 30. In one example, a first dip in HCl, followed by a second dip in $H_2O_2$ can be employed in the present application. The undercut region 32 exposes sidewall surfaces of semiconductor channel material 18 that remains beneath the gate structure 20.

Referring now to FIGS. 7A, 7B, 7C and 7D, there are illustrated various views of the semiconductor structure shown in FIGS. 6A, 6B, 6C and 6D after epitaxially growing a doped semiconductor material on exposed surfaces of each III-V compound semiconductor fin 16 not including the dielectric spacer 30 and gate structures 20 and within the undercut region 32. Notably, the doped semiconductor material grows on exposed portions of each III-V compound semiconductor fin 16 and within the undercut region 32. Some portions of the doped semiconductor material which are located atop the exposed III-V compound semiconductor fin and on one side of the gate structure provide source regions 34S for the finFET structure of the present application, other portions of the doped semiconductor material which are located atop the exposed III-V compound semiconductor fin and on an opposite side of the gate structure provide drain regions 34D for the finFET structure of the present application, while yet still other portions of the doped semiconductor material that fill the undercut region 32 located between each dielectric spacer 30 provide extension regions 34E for the FinFET structure of the present application.

Figure 7A:
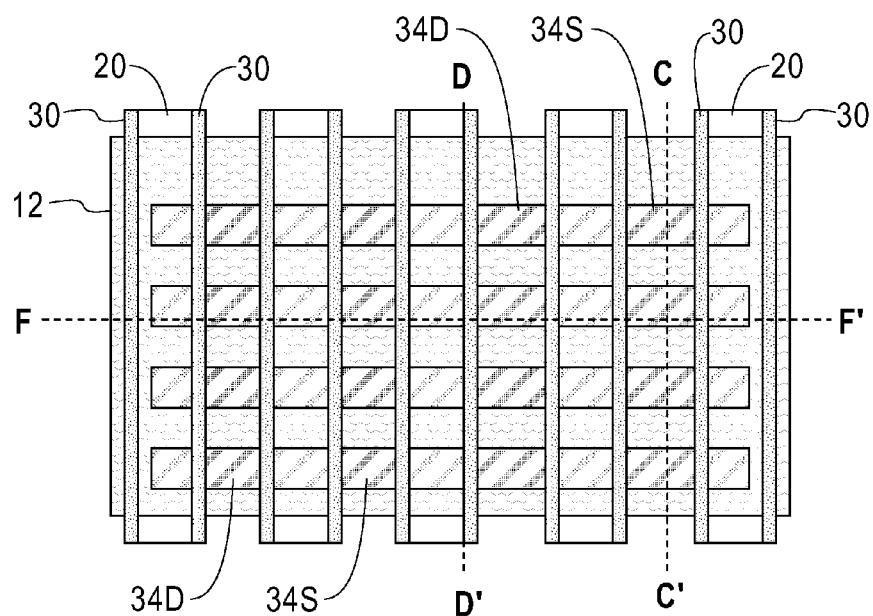
FIG. 7A is a top-down view of the semiconductor structure shown in FIG. 6A after epitaxially growing a doped semiconductor material on exposed surfaces of each III-V compound semiconductor fin not including the dielectric spacer and gate structures and within the undercut region.
Figure 7B:
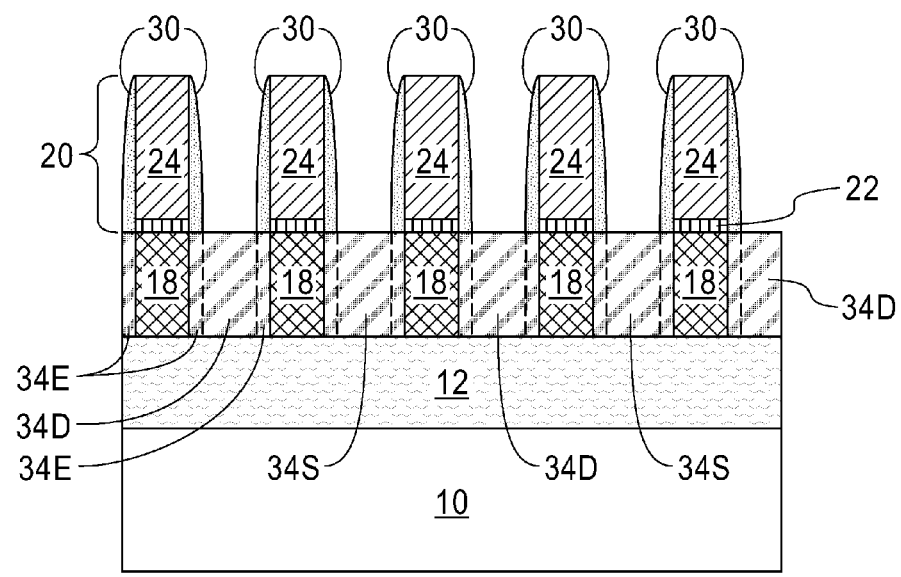
FIG. 7B is a vertical cross-sectional view of the semiconductor structure along the vertical plane F-F' of FIG. 7A.
Figure 7C:
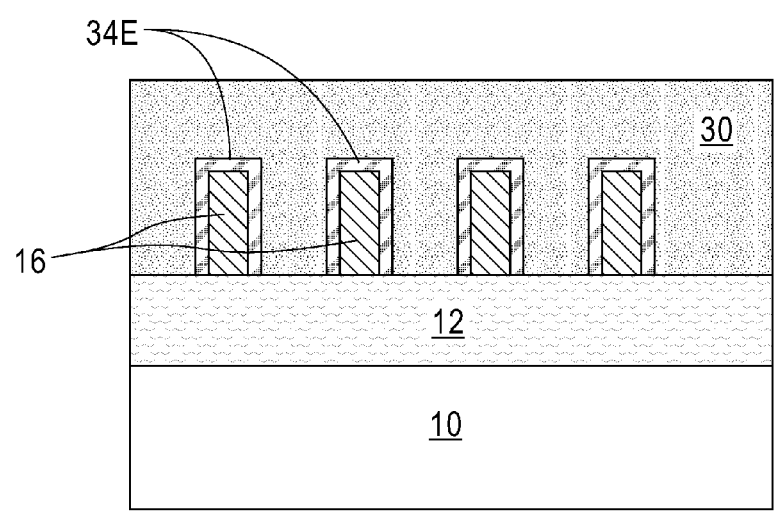
FIG. 7C is a vertical cross-sectional view of the semiconductor structure along the vertical plane D-D' of FIG. 7A.
Figure 7D:
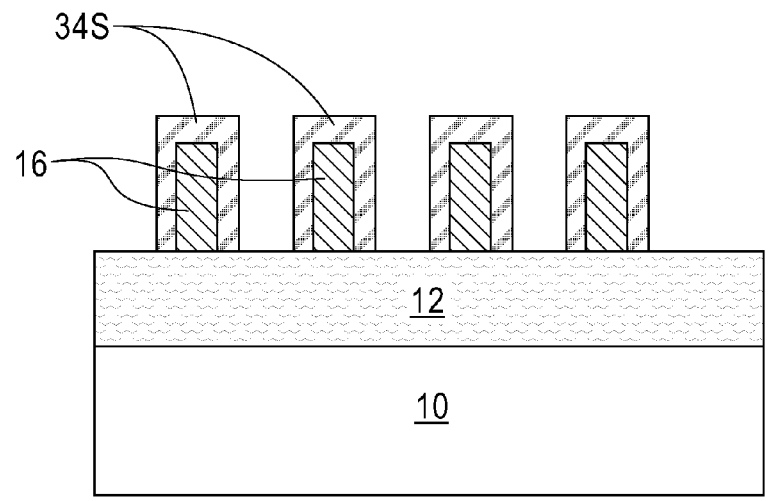
FIG. 7D is a vertical cross-sectional view of the semiconductor structure along the vertical plane C-C' of FIG. 7A.

The doped semiconductor material that provides regions 34S, 34D and 34E is epitaxial grown utilizing an in-situ doped exitaxial growth process in which an n-type or p-type doped is introduced into the semiconductor material during the deposition process. The doped semiconductor material that provides regions 34S, 34D and 34E can comprise any semiconductor material. In one embodiment of the present application, the doped semiconductor material that provides regions 34S, 34D and 34E comprises a same semiconductor material as that of semiconductor channel material 18. In some embodiments, block mask technology can be used to formed regions comprising a first doped semiconductor material and other regions that comprise a second doped semiconductor material, wherein the second doped semiconductor material comprises a different semiconductor material or dopant type than the first doped semiconductor material. As is shown in FIG. 7B, the source/drain regions (i.e., first doped semiconductor portions) 34S, 34D are located at the footprint of each gate structure. As is also shown in FIG. 7B, sidewall surfaces of each extension region 34E (comprising the second doped semiconductor portion) are in direct contact with sidewall surfaces of the semiconductor channel material 18 that remain beneath the gate structure 20. It is noted that the source/drain regions 34S, 34D and the extension regions 34E are of unitary construction comprising a same doped semiconductor material. In one embodiment of the present application, the thickness of the doped semiconductor material that provides regions 34S, 34D and 34E can be from 2 nm to 50 nm. In accordance with an aspect of the present application, the doped content of the doped semiconductor material is greater than both the semiconductor fin and the semiconductor channel material.

Referring now to FIGS. 8A, 8B, 8C and 8D, there are illustrated various views of the semiconductor structure shown in FIGS. 7A, 7B, 7C and 7D after formation of a dielectric material 36 having a topmost surface that is coplanar with a topmost surface of each gate structure 20. Dielectric material 36 can also be referred to herein as a planarized dielectric material.

In some embodiments, the dielectric material 36 may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the dielectric material 36. The use of a self-planarizing dielectric material as dielectric material 36 may avoid the need to perform a subsequent planarizing step.

In one embodiment, the dielectric material 36 can be formed utilizing a conventional deposition process including, for example, chemical vapor deposition (CVD), plasma enhanced chemical vapor deposition (PECVD), evaporation and spin-on coating. In some embodiments, particularly when non-self-planarizing dielectric materials are used, a planarization process or an etch back process follows the deposition of the dielectric material. The thickness of the dielectric material 36 that can be employed in the present application may vary depending on the type of dielectric material employed as well as the method that was employed in forming the same. In one embodiment, the dielectric material 36 has a thickness from 80 nm to 500 nm. Other thicknesses that are greater or lesser than the range provided above can also be used for the dielectric material 36.

Figure 8A:
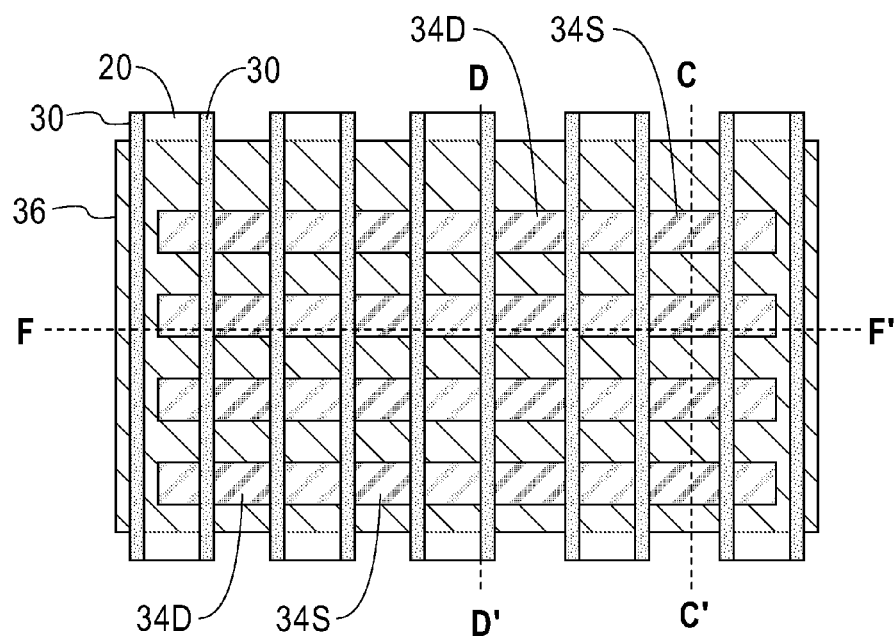
FIG. 8A is a top-down view of the semiconductor structure shown in FIG. 7A after formation of a dielectric material having a topmost surface that is coplanar with a topmost surface of each gate structure.
Figure 8B:
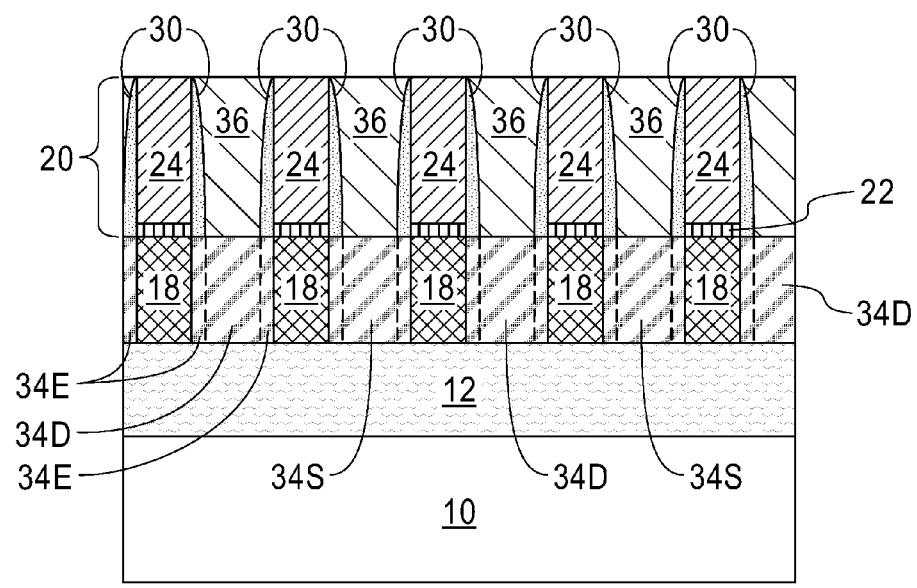
FIG. 8B is a vertical cross-sectional view of the semiconductor structure along the vertical plane F-F' of FIG. 8A.
Figure 8C:
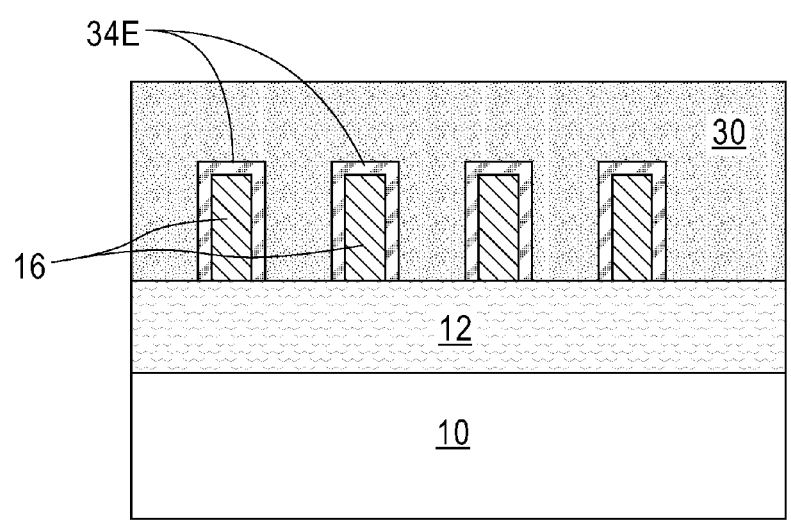
FIG. 8C is a vertical cross-sectional view of the semiconductor structure along the vertical plane D-D' of FIG. 8A.
Figure 8D:
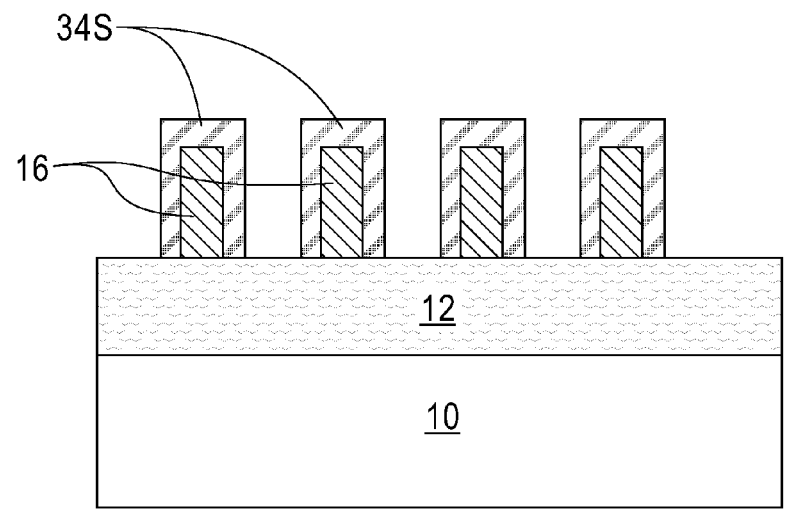
FIG. 8D is a vertical cross-sectional view of the semiconductor structure along the vertical plane C-C' of FIG. 8A.
Figure 9A:
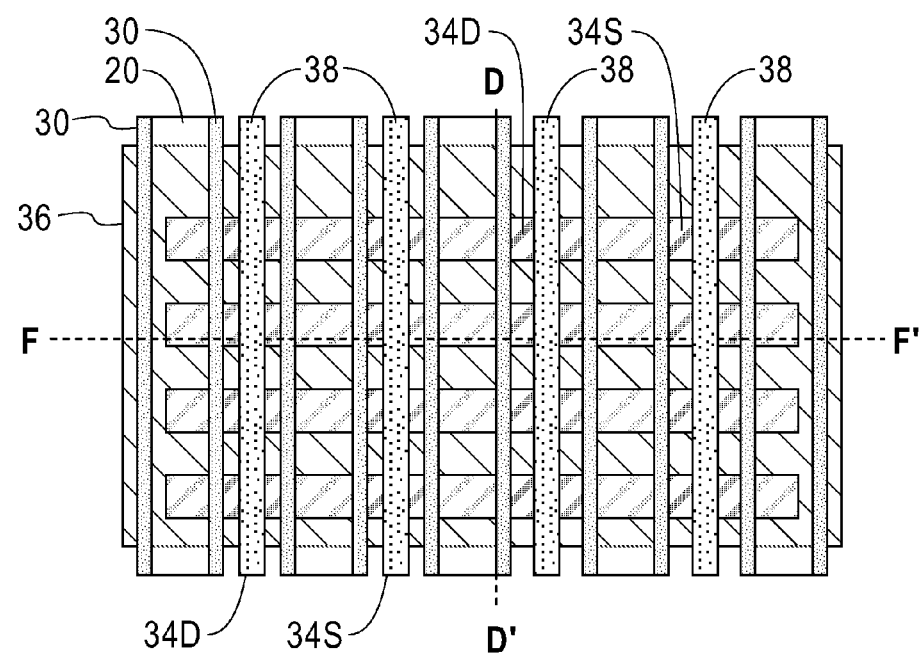
FIG. 9A is a top-down view of the semiconductor structure shown in FIG. 8A after formation of a plurality of via contact structures in the dielectric material which extend from the topmost surface of the dielectric material to an upper surface of a doped semiconductor material portion located on each side of the gate structure.
Figure 9B:
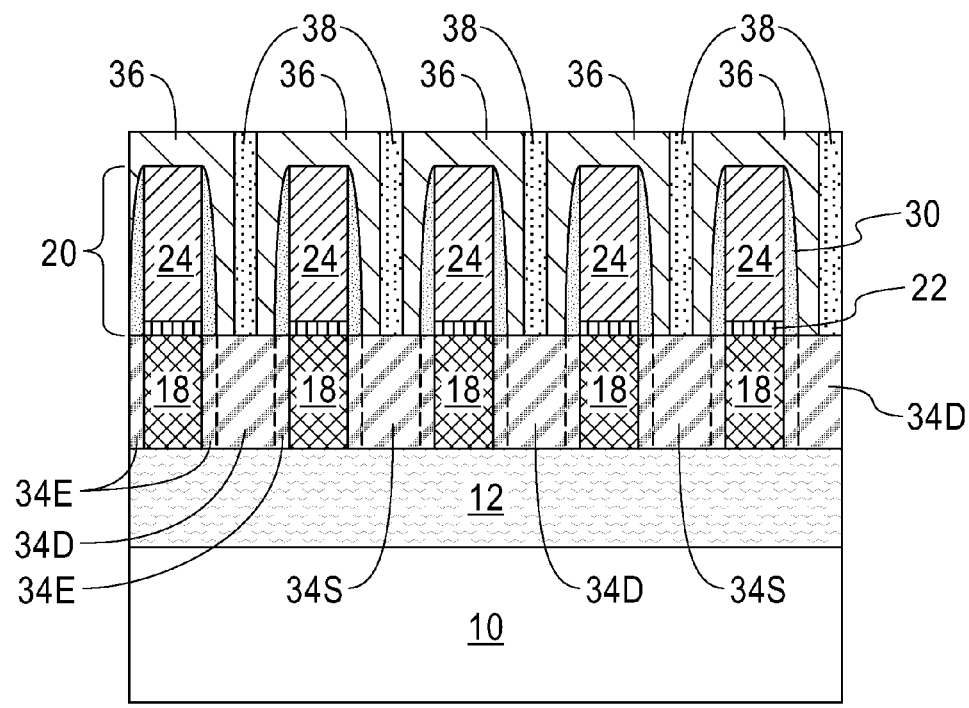
FIG. 9B is a vertical cross-sectional view of the semiconductor structure along the vertical plane F-F' of FIG. 9A.
Figure 9C:
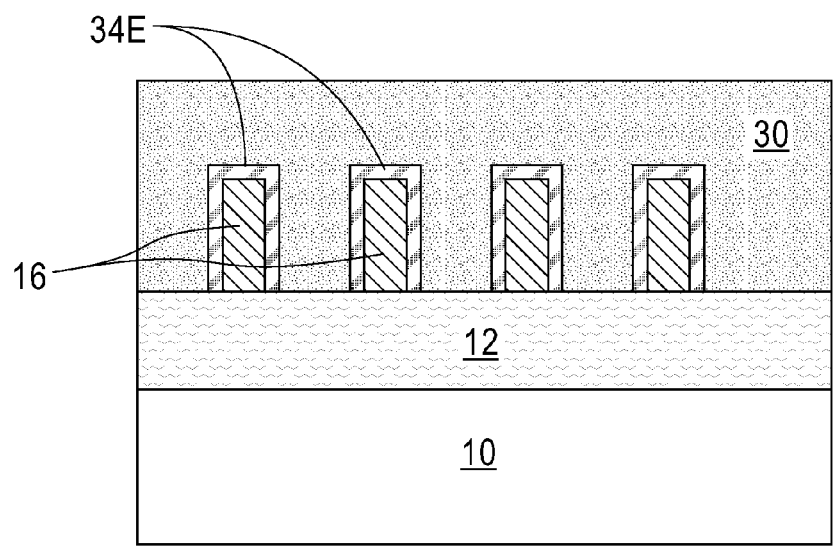
FIG. 9C is a vertical cross-sectional view of the semiconductor structure along the vertical plane D-D' of FIG. 9A.
Figure 10A:
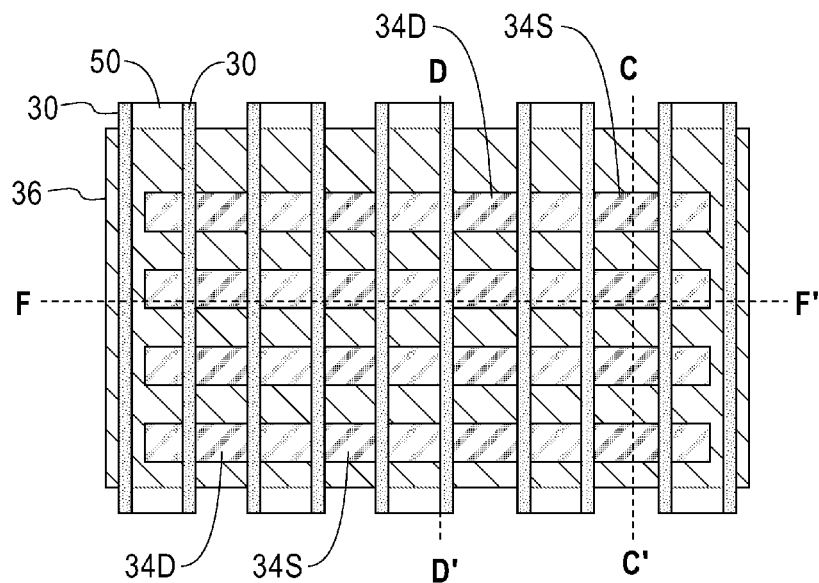
FIG. 10A is a top-down view of the semiconductor structure shown in FIG. 8A after removal of the gate structure and replacing the gate structure with a replacement gate structure in accordance with an embodiment of the present application in which the gate structure employed is a sacrificial gate structure.
Figure 10B:
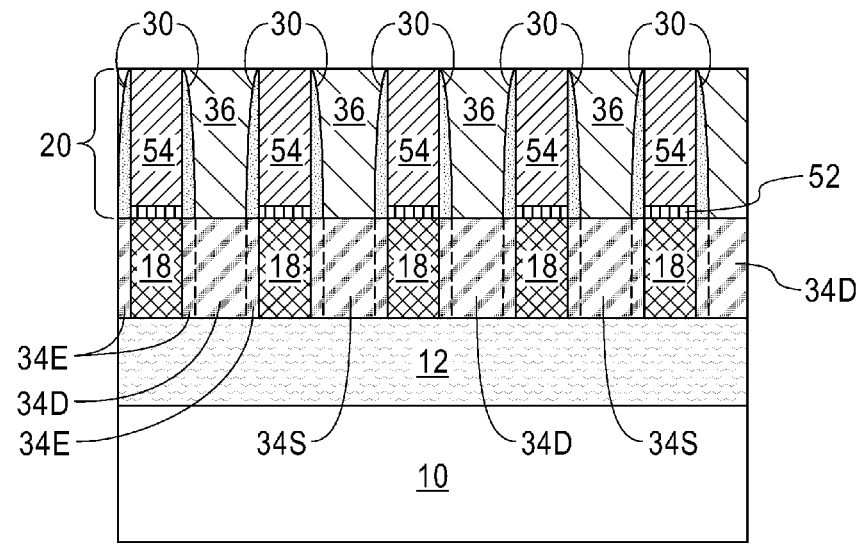
FIG. 10B is a vertical cross-sectional view of the semiconductor structure along the vertical plane F-F' of FIG. 10A.
Figure 10C:
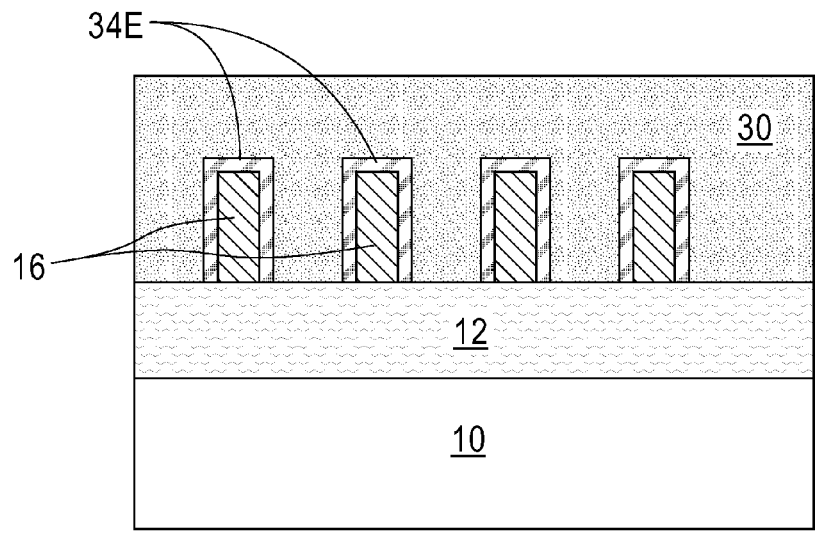
FIG. 10C is a vertical cross-sectional view of the semiconductor structure along the vertical plane D-D' of FIG. 10A.
Figure 10D:
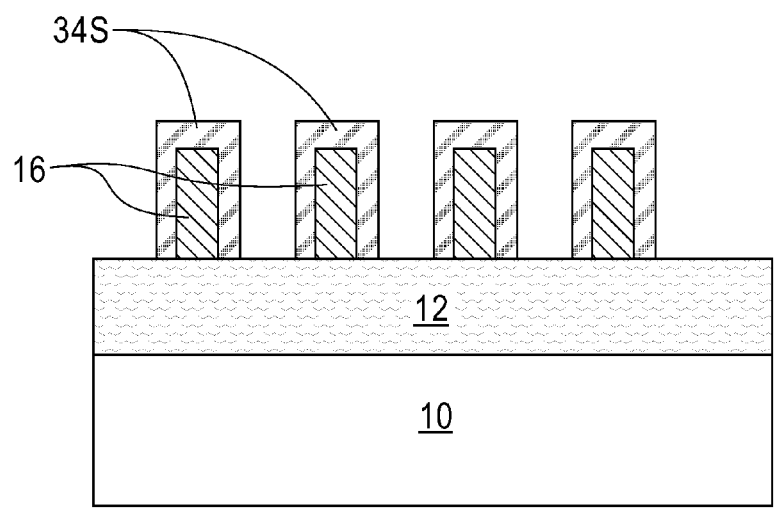
FIG. 10D is a vertical cross-sectional view of the semiconductor structure along the vertical plane C-C' of FIG. 10A.

Referring now to FIGS. 9A, 9B and 9C, there are illustrated various views of the semiconductor structure shown in FIGS. 8A, 8B, 8C and 8D after formation of a plurality of via contact structure 38 in the dielectric material 36 which extend from the topmost surface of the dielectric material 36 to an upper surface of a doped semiconductor material portion, i.e., 34S and 34D located on each side of the gate structure 20. The plurality of via contact structure 38 are formed by first providing a plurality of via contact openings in the dielectric material 36. The plurality of via contact openings can be formed by lithography and etching. Following the etching, a contact material such as for example W, Al, Cu or alloys thereof, can be deposited and an optional planarization process can follow the deposition of the contact material. The contact material formed into each via contact opening can be the same or different. As is shown in the drawings, each via contact structure of the plurality of via contact structure 38 has sidewalls surfaces which are spaced apart from the gate dielectric 30 by a portion of dielectric material 36.

Referring now to FIGS. 10A, 10B, 10C and 10D, there are illustrated various views of the semiconductor structure shown in FIGS. 8A, 8B, 8C and D after removal of the gate structure 20 and replacing the gate structure 20 with a replacement gate structure 50 in accordance with an embodiment of the present application in which the gate structure 20 employed is a sacrificial gate structure. In this embodiment, each sacrificial gate structure can be removed by etching. In one example, a reactive ion etch can be used to removal each sacrificial gate structure. Upon removal of each gate structure 20, a gate cavity is formed. Each gate cavity is formed in an area previously occupied by a gate structure 20 and the width of each gate cavity extends from a vertical sidewall of one dielectric spacer 30 to an opposing vertical sidewall of another dielectric spacer 30.

Within each gate cavity, a replacement gate structure 50 which includes a functional gate structure is formed. The replacement gate structure 50 includes a gate dielectric material portion 52 and a gate conductor material portion 54. In some embodiments, and as shown in FIGS. 10A, 10B 10C and 10D, the gate dielectric material portion 52 is present only within a bottom portion of each gate cavity. In another embodiment of the present application (not shown), the gate dielectric material portion 52 includes vertically extending portions that directly contact exposed vertical sidewalls of each spacer 30 defining the width of each gate cavity. In such an embodiment, each vertically extending portion of gate dielectric material portion 52 laterally separates gate conductor material portion 54 from the vertical sidewall surfaces of the dielectric spacer 30.

The gate dielectric material portion 52 of the replacement gate structure 50 can include one of gate dielectric materials mentioned above for gate dielectric material portion 22 and one of the deposition processes mentioned above in forming the gate dielectric material portion 22 can also be used in forming gate dielectric material portion 22. The gate conductor material portion 54 of the replacement gate structure can include one of gate conductor materials mentioned above for gate conductor material portion 24 and one of the deposition processes mentioned above in forming the gate conductor material portion 22 can also be used in forming gate conductor material portion 54. The semiconductor structure illustrated in FIGS. 10A, 10B, 10C and 10D can now be processed as described above in FIGS. 9A, 9B and 9C.

Notwithstanding which embodiment of the present application is used, a semiconductor structure is provided (See, for examples, FIGS. 8A, 8B, 8C, 8D, 9A, 9B, 9C, 10A, 10B, 10C and 10D) that includes a semiconductor fin 16 comprising a III-V compound semiconductor material located on a surface of an insulator layer 12. The semiconductor structure of the present application further includes a functional gate structure (20 or 50) orientated perpendicular to and straddling a portion of the semiconductor fin 16, wherein a semiconductor channel material 18 having an electron mobility greater than silicon and comprising a different semiconductor material than the semiconductor fin 16 is located beneath the functional gate structure (20 or 50). In some embodiments, the semiconductor channel material 18 has sidewall surfaces that are vertically aligned to edges of the functional gate structure (20 or 50). In accordance with the present application, the semiconductor channel material 18 is present on at least each vertical sidewall of the semiconductor fin 16. In some embodiments, a portion of the semiconductor material 18 is also present on a topmost surface of the semiconductor fin 16. The semiconductor structure of the present application also includes a dielectric spacer 30 located on each vertical sidewall surface of the functional gate structure (20 or 50). The semiconductor structure of the present application yet further includes a doped semiconductor material (34D, 34S and 34E) located on each side of the functional gate structure (20 or 50) and underneath each dielectric spacer 30, wherein a portion of the doped semiconductor material 34E located beneath each dielectric spacer 30 directly contacts a sidewall surface of semiconductor channel material 18 located on each vertical sidewall of the semiconductor fin 16. The doped semiconductor material portions 34S and 34S are the source and drain regions of the semiconductor structure of the present application. In accordance with the present application, the doped semiconductor material has a higher doped content than both the semiconductor fin and the semiconductor channel material. In one embodiment, the doped semiconductor material can have a dopant content of from 5E19 atoms/cm$^3$ to 1E21 atoms/cm$^3$.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure comprising:
    forming a semiconductor fin comprising an III-V compound semiconductor material on a surface of an insulator layer;
    epitaxially growing a semiconductor channel material on exposed surfaces of the semiconductor fin, wherein said semiconductor channel material has an electron mobility greater than silicon and comprises a different semiconductor material than said semiconductor fin;
    forming a gate structure straddling a portion of the semiconductor fin, wherein said gate structure is orientated perpendicular to said semiconductor fin, and wherein a dielectric spacer is present on each vertical sidewall of said gate structure;
    selectively etching portions of the semiconductor channel material from atop the structure not protected by the gate structure and from beneath each dielectric spacer, wherein an undercut is provided beneath each dielectric spacer; and
    epitaxially growing a doped semiconductor material having a higher dopant content than both said semiconductor fin and said semiconductor channel material on surfaces of the semiconductor fin not including the dielectric spacer and gate structure and within the undercut region.

2. The method of claim 1, further comprising forming a dielectric material having a topmost surface that is coplanar with a topmost surface of said gate structure.

3. The method of claim 2, wherein said gate structure comprises a sacrificial gate structure.

4. The method of claim 3, further comprising removing the sacrificial gate structure and replacing the same with a replacement gate structure.

5. The method of claim 2, further comprising forming a plurality of via contact structures in said dielectric material, wherein each via contact structure of the plurality of via contact structures contacts a topmost surface of a portion of said doped semiconductor material on surfaces of the semiconductor fin.

6. The method of claim 1, wherein said selectively etching comprises an anisotropic etch.

7. The method of claim 1, wherein said gate structure comprises a functional gate structure comprising, from bottom to top, a gate dielectric material portion and a gate conductor material portion, and wherein sidewall surfaces of the gate dielectric material portion and the gate conductor material portion are vertically coincident to each other.

8. The method of claim 1, wherein said semiconductor channel material comprises an III-V compound semiconductor material or an II-VI compound semiconductor material.

9. The method of claim 1, wherein said doped semiconductor material comprises a same semiconductor material as said semiconductor channel material.

10. The method of claim 1, wherein epitaxially growing said doped semiconductor material comprises an in-situ doped epitaxial growth process.

* * * * *